United States Patent [19]
Watanabe

[11] Patent Number: 5,317,193
[45] Date of Patent: May 31, 1994

[54] CONTACT VIA FOR SEMICONDUCTOR DEVICE

[75] Inventor: Shinya Watanabe, Hyogo, Japan

[73] Assignee: Mitsubishi Denki Kabushiki Kaisha, Tokyo, Japan

[21] Appl. No.: 29,509

[22] Filed: Mar. 11, 1993

[30] Foreign Application Priority Data

May 7, 1992 [JP] Japan ................................. 4-114945

[51] Int. Cl.$^5$ ...................... H01L 23/48; H01L 29/40
[52] U.S. Cl. .................... 257/774; 257/775; 257/773
[58] Field of Search .......................... 257/774, 775, 773

[56] References Cited

U.S. PATENT DOCUMENTS 4,640,738  2/1987  Fredericks et al. ................. 257/774
4,872,050  10/1989  Okamoto et al. .................... 257/774
5,063,175  11/1991  Broadbent ........................... 257/774

FOREIGN PATENT DOCUMENTS 60-224245  11/1985  Japan ................................... 257/775

OTHER PUBLICATIONS

Nojiri et al, "Microwave Plasma Etching of Silicon Dioxide for Half-Micron ULSIs", Amended Abstract of the 21st Conference on Solid State Devices and Materials (1989), pp. 153–156.

Kato et al, "Measurement of Ion Scattering Observed by Etching Feature in Reactive Ion Etching", 1989 Dry Process Symposium, pp. 33–38.

*Primary Examiner*—William D. Larkins
*Assistant Examiner*—Stephen D. Meier
*Attorney, Agent, or Firm*—Lowe, Price, LeBlanc & Becker

[57] ABSTRACT

The etching selectivity is controlled by appropriately changing the dimension of the opening of each contact holes in forming simultaneously a plurality of contact holes of different depth by etching. By forming a dent in advance underlying the region where a contact hole is to be formed, the depth of the contact hole can be increased, whereby difference in the depths of the plurality of contact holes can be reduced. As a result, damage in the underlying layer or under etching in forming a plurality of contact holes of different depth simultaneously by etching can be solved.

9 Claims, 16 Drawing Sheets

FILM THICKNESS DISTRIBUTION OF FILM TO BE ETCHED (Å)

VARIATION DISTRIBUTION OF ETCHING RATE (Å/min)

CONTACT VIA FOR SEMICONDUCTOR DEVICE

BACKGROUND OF THE INVENTION

1. Field of the Invention

The present invention relates to a semiconductor device and a method of manufacturing thereof, and more particularly, to a technique for solving various problems caused by difference in depths of contact holes in forming a semiconductor device having a plurality of contact holes of different depths.

2. Description of the Background Art

A conventional semiconductor device having a plurality of contact holes of different depths and a method of manufacturing thereof will be described hereinafter taking a DRAM (Dynamic Random Access Memory) as an example.

FIG. 19 is a sectional view of a memory cell portion of a DRAM having a memory cell called a stacked capacitor structure. Referring to FIG. 19, a memory cell of a conventional stacked capacitor structure has a MOS (metal oxide semiconductor) type field effect transistor formed on an active region isolated by a field insulating film 2 on the surface of a semiconductor substrate 1, and a capacitor having a stacked structure formed in the proximity thereof. The MOS type field effect transistor has impurity diffusion regions 3 and 4 which become the source/drain region formed on the surface of the semiconductor substrate 1, and a gate electrode 6a which becomes a word line formed on the surface of the semiconductor substrate in the region sandwiched between the impurity diffusion regions 3 and 4 with a gate insulating film 5 thereunder. A plurality of word lines are arranged in parallel. A gate electrode 6b is located on the field insulating film 2 parallel to the gate electrode 6a. On insulating film 7a and 7b covering the gate electrodes 6a and 6b, respectively, a lower electrode 8, an upper electrode 10, and a dielectric film 9 sandwiched therebetween of a capacitor which becomes the storage node are formed.

The lower electrode 8 of the capacitor is electrically connected to the impurity diffusion region 4 in a contact hole 4a. On the upper electrode 10 of the capacitor, a conductive layer 12 which becomes a bit line is formed with an interlayer insulating film 11 therebetween. The conductive layer 12 is electrically connected to the impurity diffusion region 3 in a contact hole 13 provided in the interlayer insulating film 11.

A relatively planar interlayer insulating film 14 is formed on the conductive layer 12. A conductive layer 15 having a two layered structure of a barrier metal layer 15a such as of TiN and an aluminum alloy layer 15b such as of Al-Si-Cu is formed on the surface of the interlayer insulating film 14. The conductive layer 15 is conductive with the gate electrodes 6a and 6b via a contact hole in a position not seen in the sectional view of FIG. 19. The conductive layer 15 is an interconnection for the purpose of improving conductivity of a word line, and an interconnection that is electrically connected to the surface of the semiconductor substrate 1 or to the surface of the upper electrode 10 of the capacitor in a peripheral circuit portion of the memory cell. A passivation film 16 is formed covering the conductive layer 15 on the interlayer insulating film 14.

The DRAM structured as described above has the conductive interconnection 15 and the semiconductor substrate 1, or the conductive interconnection 15 and the upper electrode 10 of the capacitor electrically connected via a contact hole formed in the interlayer insulating film in the peripheral circuit portion thereof.

The contact hole 20 for electrically connecting the conductive interconnection 15 and the surface of semiconductor substrate 1 is relatively high (i.e. has a depth of $d_1$) if the interlayer insulating films 17, 18 and 19 are subjected to thermal process for planarization, as shown in FIG. 20, and is formed by anisotropic etching using a resist mask 21 as the mask. If planarization process of the interlayer insulating films 17, 18 and 19 is not carried out, the contact hole 20 is relatively shallow (i.e. has a depth $d_2$ : $d_2 < d_1$), as shown in FIG. 21. The contact hole 22 for electrically connecting the conductive interconnection 15 to the upper electrode (cell plate) 10 of the capacitor does not penetrate the interlayer insulating film 17 as shown in FIG. 22, and is formed relatively shallow ($d_3 < d_1, d_2$) with a resist mask 23 as the mask since the interlayer insulating films 18 and 19 at this position are relatively thin in comparison with the position shown in FIG. 20.

The difference in depth of contact holes 20 and 22 in relation to the thickness of the interlayer insulating films 17, 18 and 19 are shown in specific numeric figures in the following Table 1.

TABLE 1

| Comparison of Contact Hole Depth (unit: angstrom) | | |
|---|---|---|
| Penetrated Interlayer Insulating Film | Contact hole 20 | Contact hole 22 |
| Interlayer Insulating Film 17 | Approximately 1300 | Not Penetrated |
| Interlayer Insulating Film 18 | 5000–8500 | Approximately 5000 |
| Interlayer Insulating Film 19 | 4000–6000 | Approximately 4000 |
| Contact hole Depth | 10300–15800 | Approximately 9000 |

The reason why the interlayer insulating films 18 and 19 through which the contact hole 20 penetrates have a thickness of a predetermined range is as set forth in the following.

In the case where the contact hole 20 is formed at a valley sandwiched by two regions where an element such as a transistor is formed, as shown in FIGS. 20 and 21, the interlayer insulating films 18 and 19 are planarized by the reflow of a thermal treatment, or by etching back the whole surface by dry etching. It can be appreciated from the comparison of FIGS. 20 and 21 that the thickness at the position for forming the contact hole 20 in the interlayer insulating film 18 and 19 is increased in FIG. 20 where a planarization process is applied in comparison with FIG. 21 where a planarization process is not applied. If a planarization process is not carried out as shown in FIG. 21, the interlayer insulating films 18 and 19 at the position for forming the contact hole 20 is relatively thin, whereby the depth of the contact hole 20 is smaller than the depth of d in the case of FIG. 20. Although this is advantageous from the standpoint of reducing the time required for etching the contact hole 20, a stepped portion will be generated between the region for forming the contact hole 20 and the adjacent region where an element is formed due to difference in the thickness of the interlayer insulating films 18 and 19. This stepped portion will cause resolution deficiency in the resist pattern because a stepped portion exceeding the depth of focus of the exposure device is generated at the time of photolithography for forming the contact hole 20, or at the time of a later photolithography for a conductive interconnection at a later process. Also, if the conductive interconnection is formed of aluminum interconnection and the photolithography process is carried out using a positive resist, an undesirable phenomenon called halation occurs in which the resist pattern for conductive interconnection is exposed and eliminated due to light reflectance from the underlying stepped portion during exposure, in addition to the above described resolution deficiency.

A planarization process for each interlayer insulating film is indispensable to suppress such undesirable phenomenon, and the thickness of the oxide film of the contact hole formation portion depends upon the planarization process.

Referring to FIG. 22 which is a sectional view showing a formation step of the contact hole 22 on the upper electrode (cell plate) 10 of the capacitor, the film thickness of the region for forming the contact hole is not increased even after the above-described planarization process because there is no word line below the upper electrode 10. Also, because the contact hole 22 does not penetrate the interlayer insulating film 17, the depth $d_3$ of the contact hole 22 is smaller by approximately 6000–7000Å in comparison with the case shown in FIG. 20 where the contact hole 20 has a depth of $d_1$.

Because a conventional semiconductor device is formed as above with a contact hole 20 of a relatively great depth and a contact hole 23 of a relatively small depth, a process of etching both holes simultaneously will result in the doped polysilicon of the underlying upper electrode 10 of the capacitor being etched to form a hole as shown in FIG. 23 because the contact hole 23 will be excessively overetched if the etching time is set to form thoroughly the contact hole 20. Therefore, when a conductive interconnection having a double structure of a barrier metal layer 31 such as of TiN and an aluminum alloy layer 32 is formed in the contact hole 22, as shown in FIG. 24, the junction between the barrier metal 31 and the upper electrode 10 will be established only at a small region along the inner perimeter of the contact hole 20 to become the cause of conduction deficiency.

Even if the doped polysilicon layer of the upper electrode 10 is not thoroughly penetrated, and the film thickness of the upper electrode 10 is reduced to less than approximately 700Å as shown in FIG. 25, alloy is made of the Ti of the barrier metal layer and the polysilicon, i.e. formation of a TiSi$_2$ layer 33 progresses due to silicidation as shown in FIGS. 26 and 27 because of being subjected to a high temperature of 800° C. in lamp annealing under an N$_2$ ambient for the formation of a barrier metal 31. As a result, the doped polysilicon at the bottom of the contact hole 20 and also in the proximity of the side portion of the bottom of the contact hole is absorbed by the Ti to generate a void 34 which is shown in enlargement in FIG. 27. If the void 34 is significant, the upper electrode 10 is disconnected in the worst case. The limitation of the film thickness of a doped polysilicon layer in which a void 34 is generated is generally approximately 700Å although depending on the film nature of the Ti and the lamp anneal temperature. It is therefore necessary to set the film thickness of the doped polysilicon layer to be approximately 1000Å after the formation of a contact hole by dry etching and taking into consideration a manufacturing error margin. It is desired that the generation of the void 34 is prevented without increasing the film thickness in order to reduce the film thickness of the device.

The limitation of adjusting the etching time period will be described hereinafter. In general, the etching time T of dry etching for forming a contact hole is set by including to the etching time $T_1$ for forming just the deepest contact hole, an overetching time $T_2$ taking into consideration error in the designed film thickness of each interlayer insulating film which is the film to be etched and the variation error of the etching rate of the dry etching device, i.e. $T = T_1 + T_2$. The variation error of the etching rate of the dry etching device is caused by difference in the etching rate between semiconductor wafers, difference in the etching rate between wafers, and difference in the etching rate between batches in the case of a batch system dry etching. The film thickness distribution among semiconductor wafers and the distribution of the etching rate are shown in FIG. 28A and 28B. In the case where the thickness of the film to be etched moves towards the thinner direction (in the direction of arrow A in FIG. 28) and the etching rate moves towards the faster rate (in the direction of arrow D in FIG. 28B), there is a high probability of the doped polysilicon of the upper electrode 10 (cell plate) of the capacitor being overetched as shown in FIGS. 23 and 25. Conversely, in the case where the thickness of the film to be etched moves towards the thicker direction (the direction of arrow B in FIG. 28A) and the etching rate move towards a slower rate (the direction of arrow C of FIG. 28B), the deepest contact hole is not thoroughly formed. In the case of the contact hole 20 shown in FIG. 20, there is a high probability of the conductance between the conductive interconnection formed on the interlayer insulating film 19 and the surface of the semiconductor substrate 1 being not established. If the overetching time $T_2$ is increased, the probability of the generation of the latter will be reduced, but the probability of generation of the former will increase. Conversely, if $T_2$ is reduced, the probability of the former will be decreased but the probability of the latter will increase. By analyzing the test result of good product selection, the probability occurrence thereof was 5% at $3\sigma$ respectively.

Although the probability of the problem will be reduced if the thickness of the doped polysilicon of the upper electrode (cell plate) 10 of the capacitor is increased, such an increase in thickness will result in a greater stepped portion with a greater possibility of the trouble at a later processing step. It is not desirable to employ the means of increasing the film thickness since reduction of the film thickness of each layer is a mandatory condition in the development of a semiconductor device of higher integration density.

The above-described problem becomes further significant in the case of coexistence of a contact hole 24 formed on the surface of the semiconductor substrate 1 and a contact hole 25 formed on the surface of a bit line 12 because the difference in the depth thereof is greater.

The following Table 2 shows the film thickness of the interlayer insulating films through which the contact hole 25 is penetrated and the depth of the contact holes 24 and 25 assuming that the film thicknesses of interlayer insulating films 17, 18 and 19 through which the contact hole 24 in FIG. 29 penetrates are identical to those of the contact hole 20 shown in FIG. 23.

TABLE 2

| Comparison of Contact Hole Depth (unit: angstrom) | | |
| --- | --- | --- |
| Penetrated Interlayer Insulating Film | Contact hole 24 | Contact hole 25 |
| Interlayer Insulating Film 17 | Approximately 1300 | Not Penetrated |
| Interlayer Insulating Film 18 | 5000-8500 | Not Penetrated |
| Interlayer Insulating Film 19 | 4000-6000 | Approximately 4000 |
| Contact hole Depth | 10300-15800 | Approximately 4000 |

SUMMARY OF THE INVENTION

An object of the present invention is to prevent generation of damage in the underlying layer or occurrence of insufficient etching in forming simultaneously a plurality of contact holes of different depths by an etching process in a semiconductor device.

A semiconductor device according to the present invention for achieving the above object includes an interlayer insulating film formed between conductive layers, a first contact hole formed penetrating the interlayer insulating film for electrically connecting the conductive layers, and a second contact hole having a depth greater than that of the first contact hole. The second contact hole is formed to have a diameter smaller than that of the first contact hole.

According to the semiconductor device, the etching rate is increased by reducing the diameter of a contact hole in proportion to its depth. As a result, the difference in time required for forming a plurality of contact holes due to its difference in depth in carrying out dry etching simultaneously is reduced, so that the problems of insufficient formation for a deep contact hole and overetching for a small contact hole can be solved.

According to another aspect of the present invention, a semiconductor device of the present invention includes a first interlayer insulating film formed on a semiconductor substrate, a first conductive interconnection layer formed on the first interlayer insulating film, a second interlayer insulating film formed on the first conductive interconnection layer, and a second conductive interconnection layer formed on the second interlayer insulating film. A dent having a predetermined shape and depth is formed on a predetermined position of the first interlayer insulating film, and a contact hole having a diameter smaller than that of the dent is formed on the region on the dent in the second interlayer insulating film. The first conductive layer and the second conductive layer are electrically connected by this contact hole.

According to the semiconductor device, a contact hole is formed on a dent on the first conductive interconnection layer generated by the first conductive interconnection layer being formed along the dent formed in the first interlayer insulating film, so that the contact hole has a depth greater by the depth of the dent. Therefore, it is possible to control the depth of the contact hole by setting appropriately the depth of the dent formed in the first interlayer insulating film.

A method of manufacturing a semiconductor device of the present invention includes a method of forming a plurality of contact holes each having a different depth by dry etching. In this method, the dry etching rate of a contact hole can be controlled by determining the diameters of the plurality of contact holes according to its respective depth in accordance with a relationship obtained in advance between the diameter and the dry etching selectivity of a contact hole.

According to the above two methods of manufacturing the semiconductor device, the time required for forming a plurality of contact holes of different depths can be controlled to be substantially equal by setting appropriately the diameter of each contact hole according to its depth. Therefore, the problems encountered in processing a plurality of contact holes of different depths at the same etching step can be solved easily.

According to a further aspect of the present invention, the method of manufacturing a semiconductor device of the present invention includes the steps of forming a first interlayer insulating film on a semiconductor substrate, and forming a dent having a predetermined shape and depth at a predetermined position at the surface of the first interlayer insulating film. Then, a first conductive interconnection layer is formed at the surface of the first interlayer insulating film and along the inner face of the dent, and a second interlayer insulating film is formed on the first conductive interconnection layer. Next, a contact hole is formed reaching the surface of the first conductive interconnection layer at a region above the dent, followed by the formation of a second conductive interconnection layer on the surface of the second interlayer insulating film and in the contact hole.

According to still another aspect of the present invention, a method of manufacturing a semiconductor device includes the steps of forming a first interlayer insulating film on a semiconductor substrate, forming a dent having a predetermined shape and depth at a predetermined position on the surface of the first interlayer insulating film, forming a first conductive interconnection layer at a predetermined region including the internal face of the dent at the surface of the first interlayer insulating film, forming a second interlayer insulating film to cover the surface of the first conductive interconnection layer and the surface of said first interlayer insulating film, forming a first contact hole reaching the surface of the first conductive interconnection layer above the region of the dent in the second interlayer insulating film, and forming a second contact hole penetrating the first and second interlayer insulating films at a region excluding the region where the first conductive interconnection layer is formed by dry etching simultaneously with the first contact hole. The depth of the dent is determined so that the difference in the time required to etch the first and second contact holes is within a predetermined range in accordance with difference in the depth of the first and second contact holes.

According to the method of manufacturing a semiconductor device, the surface of the first conductive interconnection layer in the region of the dent becomes lower owing to that dent formed in the first interlayer insulating film according to the depth of a contact hole to be formed, whereby the depth of a contact hole to be formed can be increased in the formation step of the contact hole formed at the dent region. As a result, the time required for forming each contact hole can be made substantially equal by appropriately setting the depth of the dent in processing a plurality of contact holes of different depths by the same etching process, so that the problem such as overetching or insufficient etching caused by difference in the depth of the contact hole can be solved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device and the method of manufacturing thereof according to a first embodiment of the present invention will be described hereinafter with reference to FIGS. 1-7.

Figure 1A:
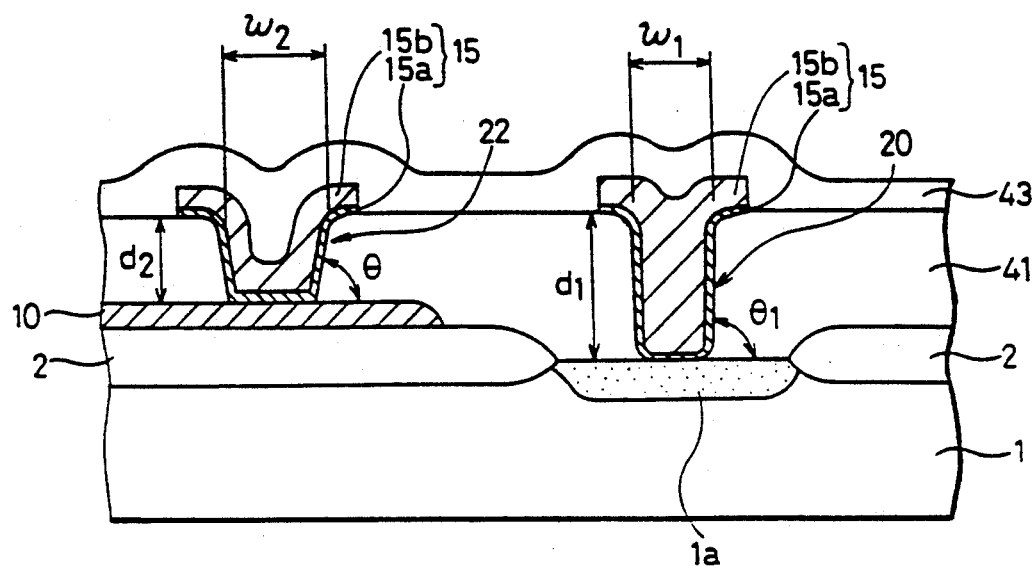
FIG. 1A is a sectional view of a structure of a semiconductor device according to a first embodiment of the present invention.
Figure 1B:
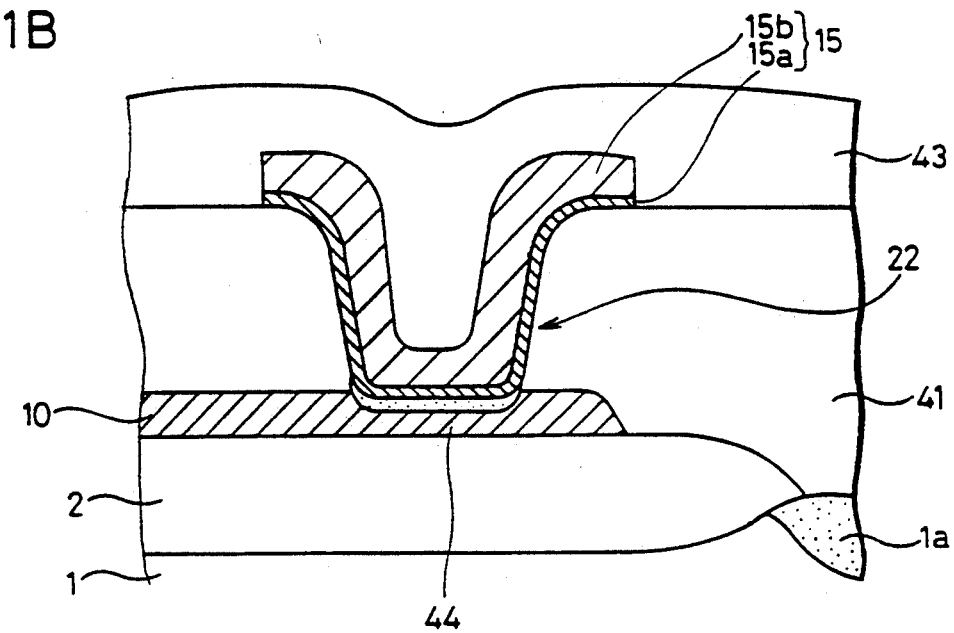
FIG. 1B is a partial enlarged sectional view thereof.

FIG. 1A shows a sectional view of a structure of a semiconductor device according to the first embodiment of the present invention, including a contact hole 20 connecting the conductive interconnection 15 and the surface of an impurity diffusion region 1a of the semiconductor substrate 1 surrounded by field insulating films 2, and a contact hole 22 connecting the conductive interconnection 15 and the upper electrode (cell plate) 10 of the capacitor.

Referring to FIG. 1A, the contact holes 20 and 22 formed in the interlayer insulating film 41 of silicon oxide film has a depth of $D_1$ and $D_2$, respectively, with the relationship of $d_1 > d_2$. The contact holes 20 and 22 respectively have a horizontal section of substantially a square with the dimension of $w_1$ square and $w_2$ square, respectively, at the surface of the interlayer insulating film 41 with the relationship of $w_1 < w_2$. Furthermore, contact holes 20 and 22 have angles of 0 and Oz with a relationship of $\theta_1 > \theta_2$.

Figure 2:
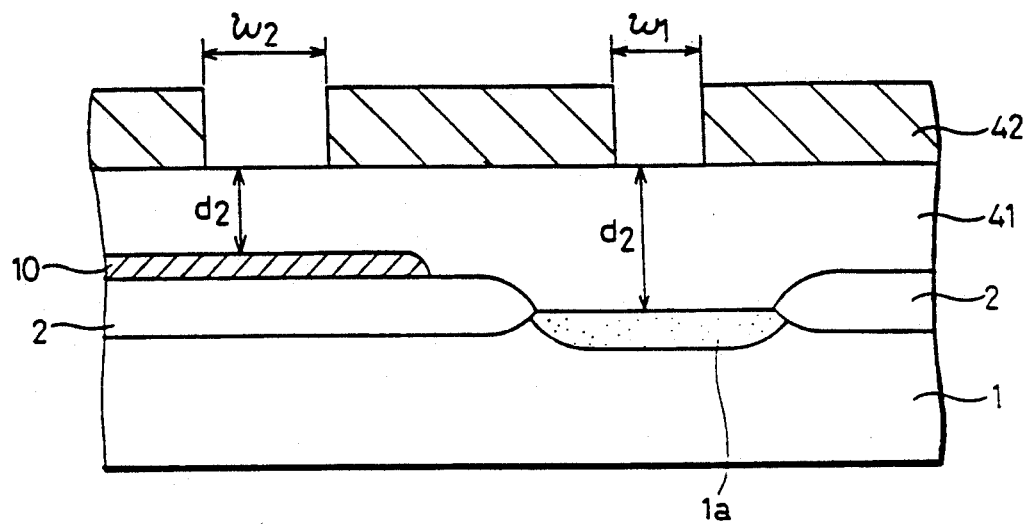
FIGS. 2-5 are sectional views of the semiconductor device according to the first embodiment of the present invention showing the manufacturing steps thereof.

A method of manufacturing the semiconductor device of the first embodiment shown in FIG. 1A will be described hereinafter. Referring to FIG. 2, a resist mask 42 having a $w_1$ square opening and a $w_2$ square opening patterned conforming to the shapes of the contact holes 20 and 22 to be opened is formed on the surface of the interlayer insulating film 41 by photolithography. Then, contact holes 20 and 22 are processed by anisotropic dry etching using a gas of $CHF_3/CF_4/Ar$ type. The mixture ratio of $CHF_3/CF_4/Ar$ (flow rate) is set to 67/53/800 (SCCM).

Figure 6A:
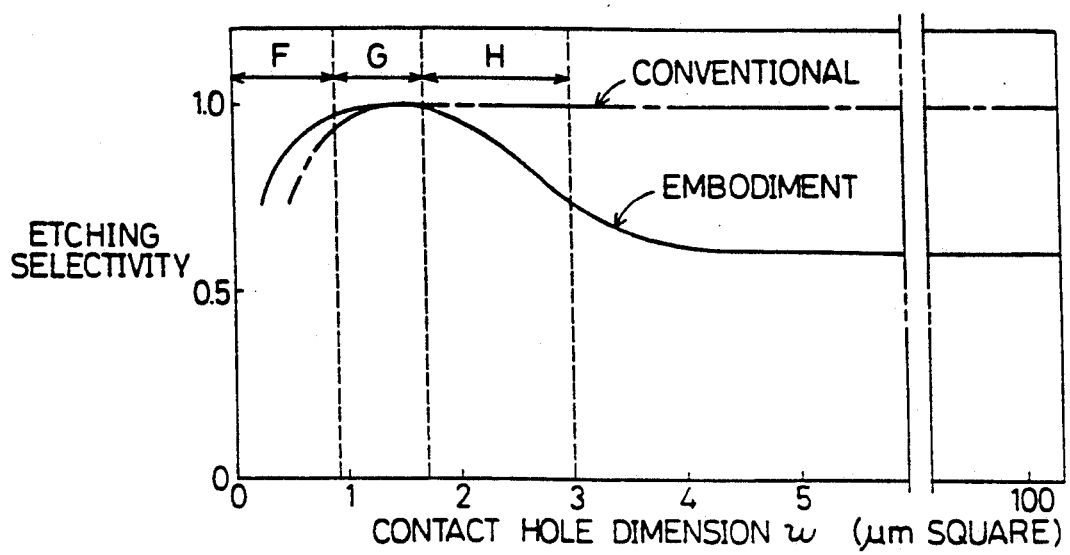
FIG. 6A shows the relationship between the dimension of the opening of the contact hole and the etching selectivity.
Figure 6B:
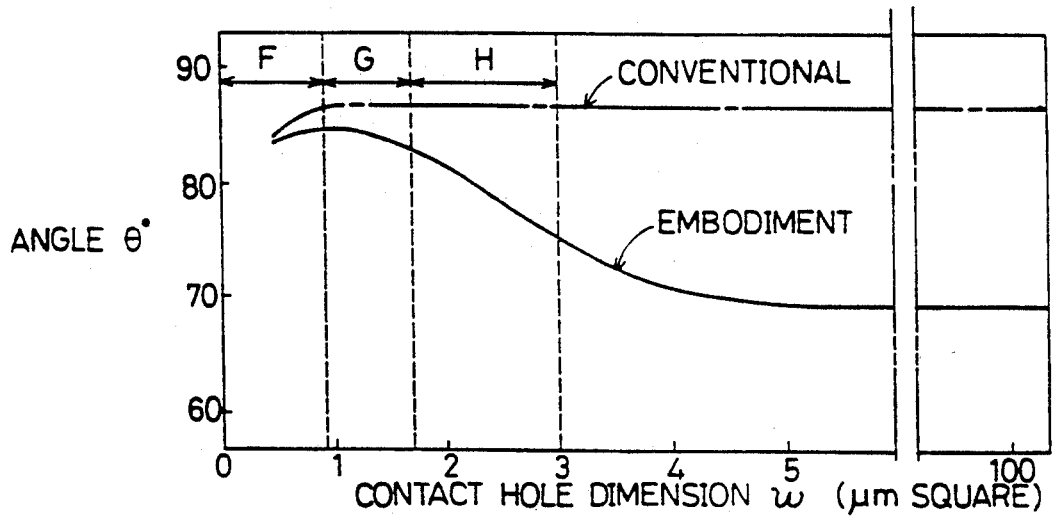
FIG. 6B shows the relationship between the dimension of the opening of the contact hole and the angle relative to a taper, where the first embodiment of the present invention and a conventional method are applied.
Figure 6C:
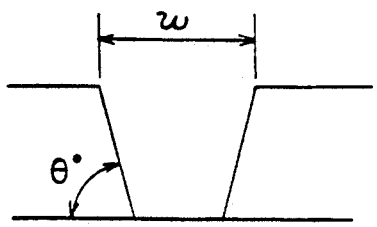
FIG. 6C is a diagram for describing the dimension w of the opening of a contact hole and an angle $\Theta°$.

The etching characteristics employing such a gas type are shown in FIGS. 6A and 6B in comparison with the usage of a mixed gas of $CHF_3/O_2$ ($O_2$ concentration approximately 10%) which is the conventionally used type of gas. The present embodiment and the conventional case are shown in a solid line and a dash-dot line, respectively, in FIGS. 6A and 6B. In FIG. 6A, the dimension w of the contact hole is plotted along the abscissa, and the etching selectivity is plotted along the ordinate with the maximum etching rate standardized as 1.0. In FIG. 6B, the abscissa is similar to that of FIG. 6A, and the ordinate takes the angle $\theta$ of the contact hole. The RF frequency of the high frequency power is 13.56 MHz in the conventional case and 380 KHz in the present embodiment. Both cases employ the cathode coupling method and the output is 800W. The pressure is set to 40 mTorr–80 mTorr in the conventional case and 800 mTorr in the present embodiment.

It can be appreciated from the graph of FIG. 6A that the etching selectivity increases monotonously in the regions F and G where the dimension w of the contact hole is small to saturate to substantially 1.0 in the region of H and those having a greater w. By contrast, the present embodiment has the etching selectivity increased monotonously in the region F and G and then monotonously decreased in the region H. According to the method of the present embodiment, the etching selectivity for a contact hole is approximately 0.7 at the right end of the region H where the value w is 3 μm. The feature of the present embodiment lies in that the difference in time required for forming contact holes caused by difference in depth is reduced by setting a greater value of w for a contact hole having a small depth of d and by setting the w for a contact hole having a greater depth of d to a smaller value according to the region H.

According to the method of controlling the etching rate depending upon the dimension of the contact hole of the present embodiment, the etching selectivity of the contact hole 22 can be reduced by approximately 30% with respect to that of the contact hole 20, and the difference in time required for etching the contact hole 22 and time required for etching the contact hole 20 can be reduced in comparison with the conventional case. Therefore, the doped polysilicon of the upper electrode 10 located at the bottom of the contact hole 22 can be prevented from being overetched.

Figure 3:
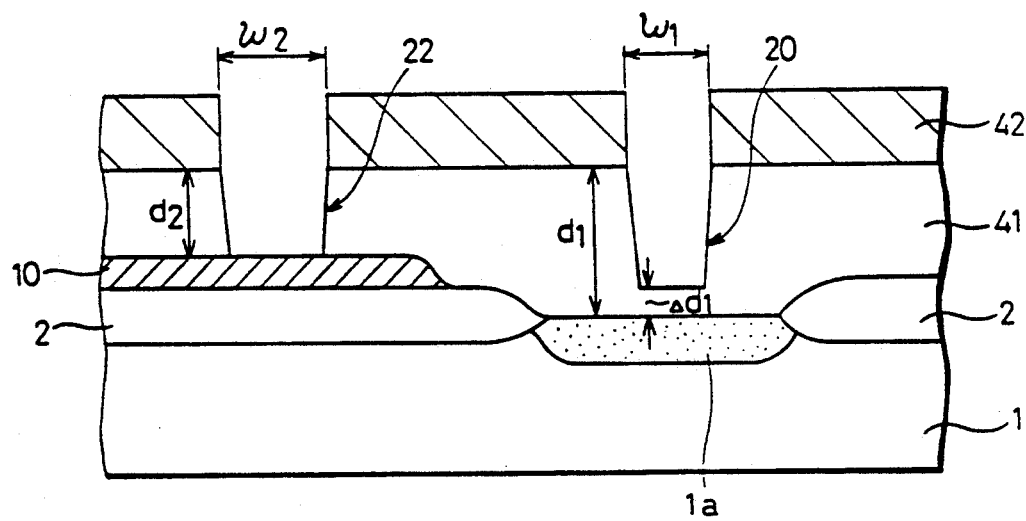
Figure 4:
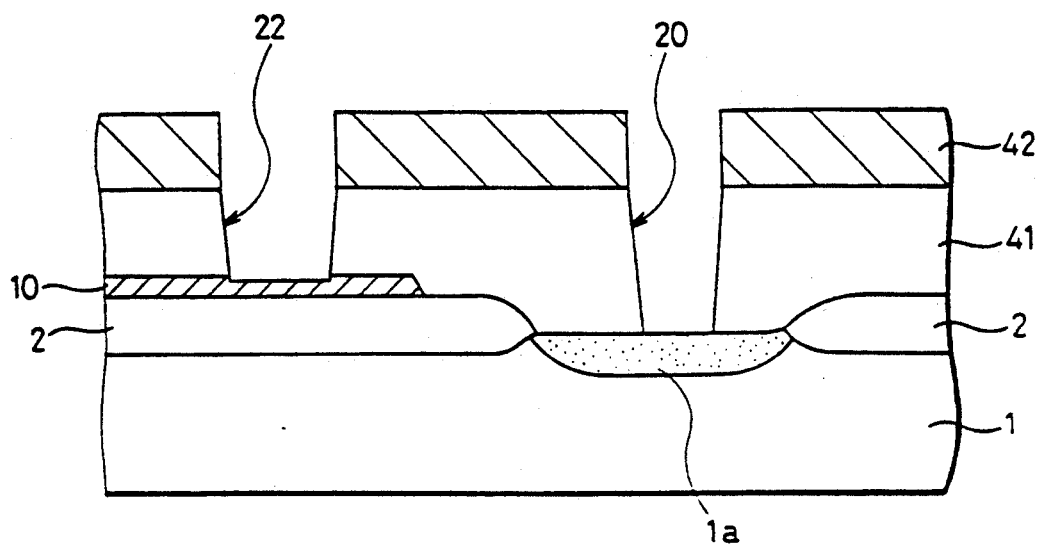
Figure 5:
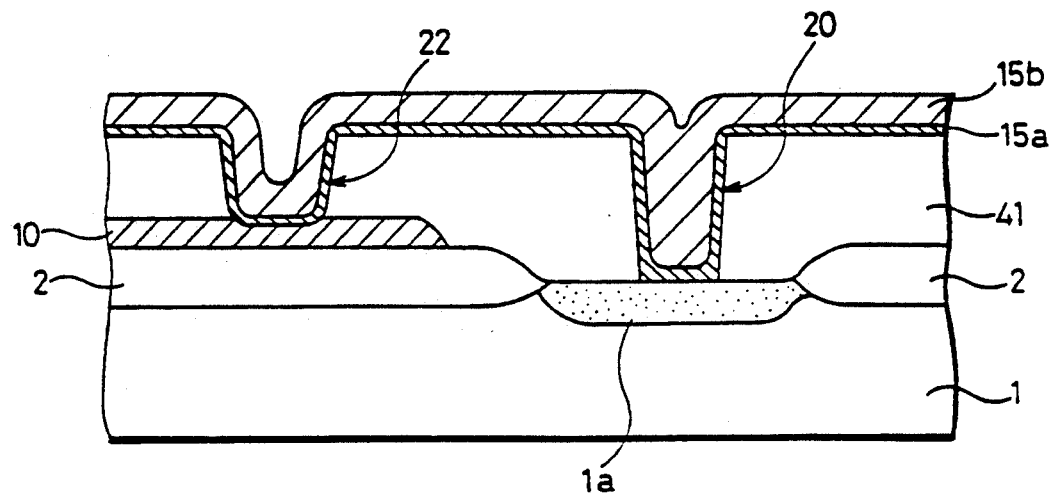
Figure 27:
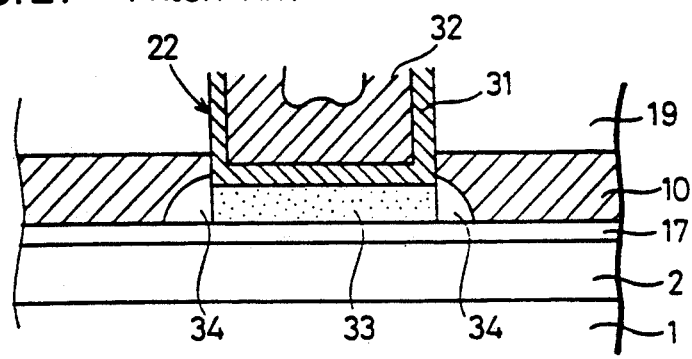
FIG. 27 is an enlarged sectional view of the portion indicated by a circle E of FIG. 26.
Figure 28A:
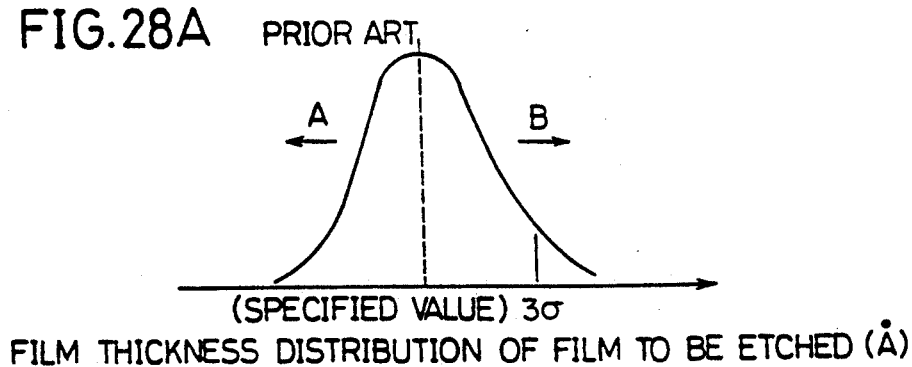
FIG. 28A shows the film thickness distribution of the film to be etched that is formed on a plurality of semiconductor wafers centered about a specified value.
Figure 28B:
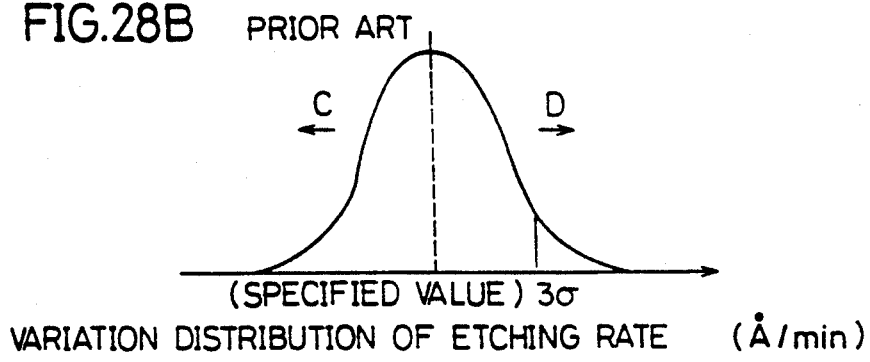
FIG. 28B shows a variation distribution of the etching rate centered about a specified value.
Figure 29:
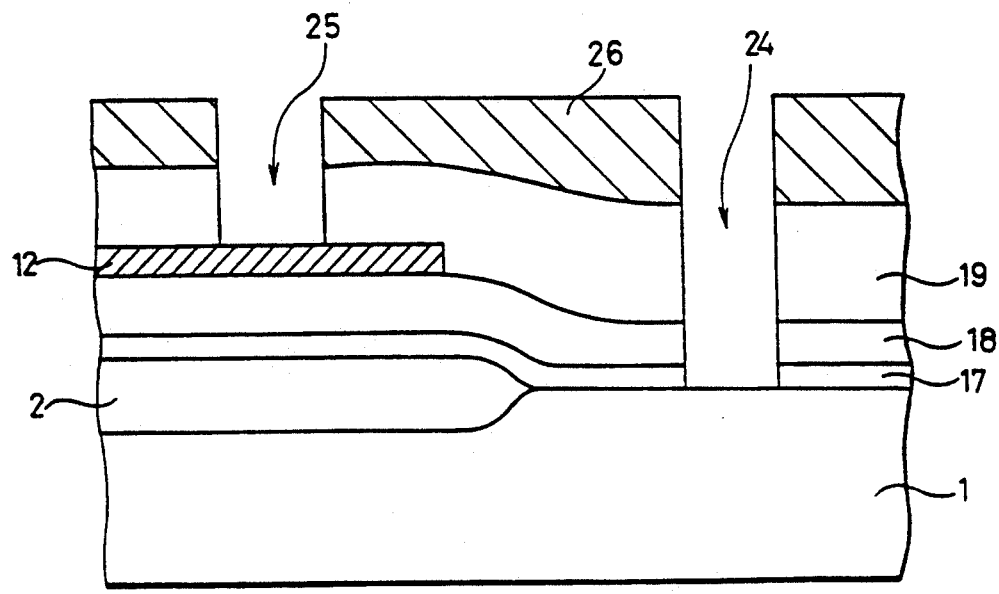
FIG. 29 is a sectional view of a semiconductor device showing an example of a structure where there is a coexistence of contact holes of different depths.
Figure 1A:
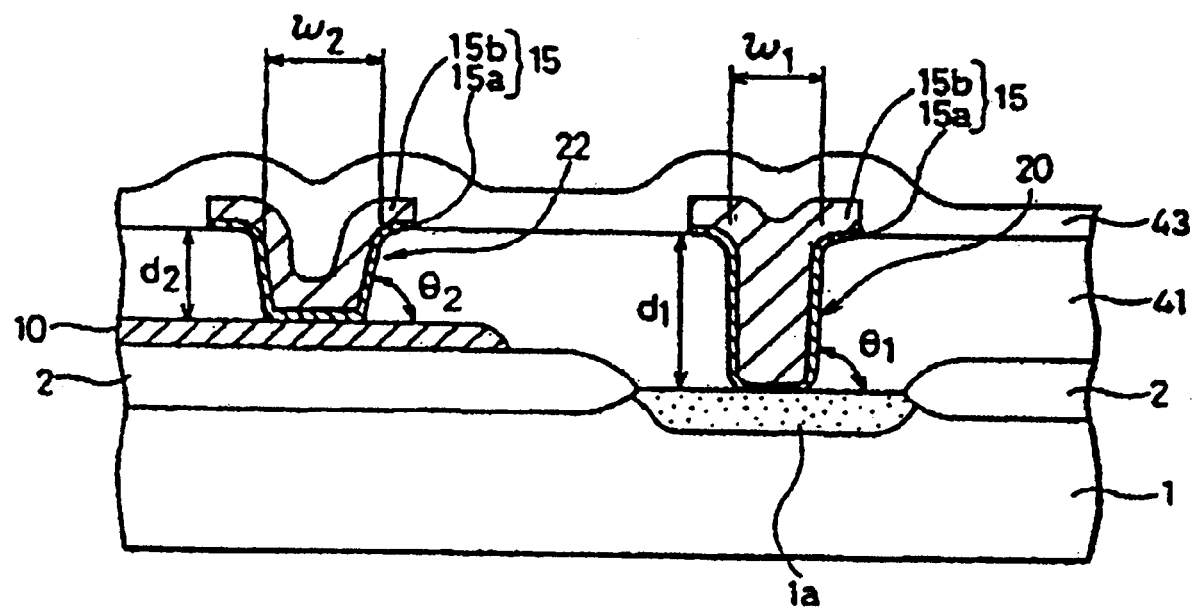
Figure 1B:
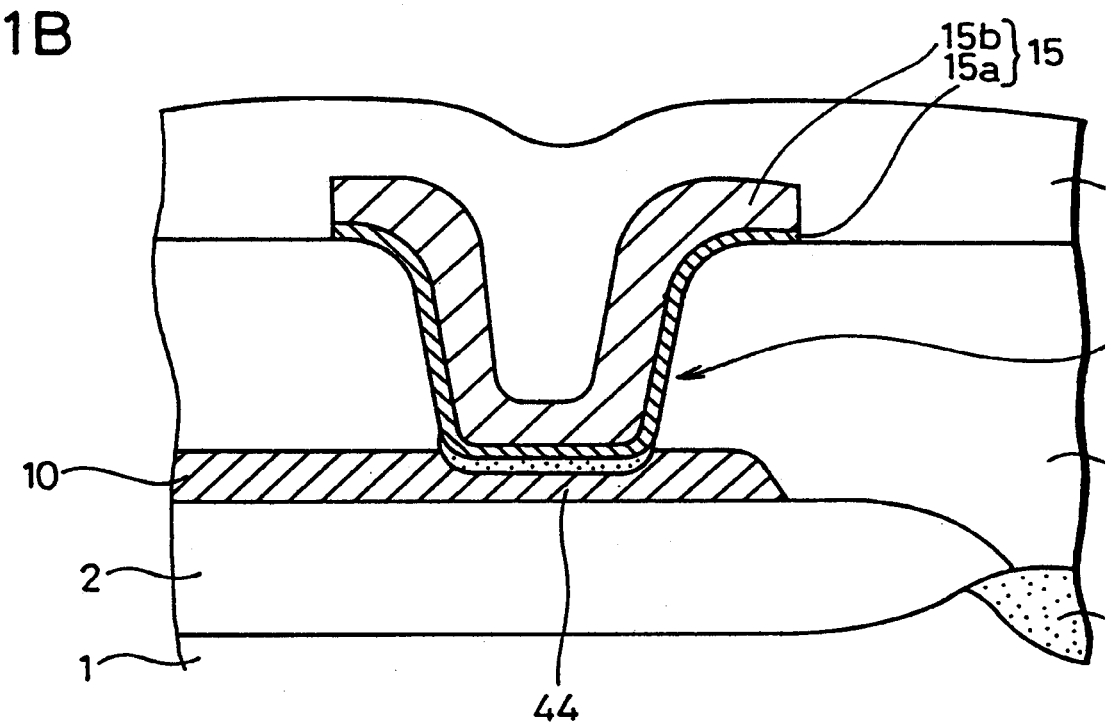

That is to say, the thickness $\Delta d_1$ of the interlayer insulating film 41 remaining under the contact hole 20 when the contact hole 22 is etched just to the surface of the upper electrode 10 can be reduced in comparison with the case where etched by a conventional method, as shown in FIG. 3. When the etching is further continued until the contact hole 20 just reaches the surface of the semiconductor substrate 1, the etched amount of the doped polysilicon of the upper electrode 10 positioned at the bottom of the contact hole 22 is further reduced in comparison with the conventional case shown in FIG. 5. As described above, a barrier metal layer 15a and an aluminum alloy layer 15b are formed all over the entire semiconductor substrate 1, as shown in FIG. 5. Even after a predetermined patterning is applied to form a passivation film 43 to complete the structure shown in FIG. 1A, the tungsten silicide layer 44 formed at the bottom of the contact hole 22 is relatively reduced as shown in the enlarged view of FIG. IB. Therefore, a void 34 is not formed as in the case of the conventional method shown in FIG. 27, and disconnection of the upper electrode 10 is prevented.

The configuration of a square for the opening of the contact hole with the dimension of a square represented as w for one side in the above embodiment is just by way of design manner. In practice, a contact hole designed as having an opening configuration of a square with one side of w will have a rounded corner to result in an opening configuration approximating a circle with a diameter of w because of the limitation of resolution in photolithography. Therefore, the dimension of the opening of a contact hole expressed as "diameter w" will result in the same meaning in practice. This also applies to the following embodiments.

The relationship between the dimension w and the angle θ of the contact hole shown in FIG. 6B will be considered. It can be appreciated from the graph of the FIG. 6B that the angle θ is saturated to approximately 87° in regions G and H according to the conventional method which is comparable to the method of the present embodiment where the angle θ decreases monotonously at the regions of G and H. This means that the amount of the deposition film at the time of etching increases monotonously in region H. The relationship between the deposited amount of the deposition film and the angle θ will be described in detail with reference to FIG. 7.

Figure 7A:
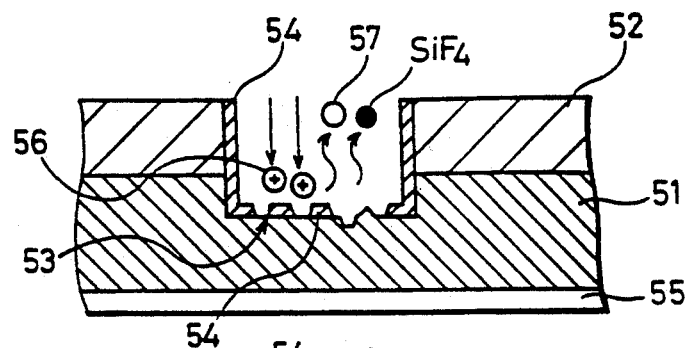
FIG. 7A-D are a sectional view of a semiconductor device schematically showing the sequential process of a taper formation.
Figure 7B:
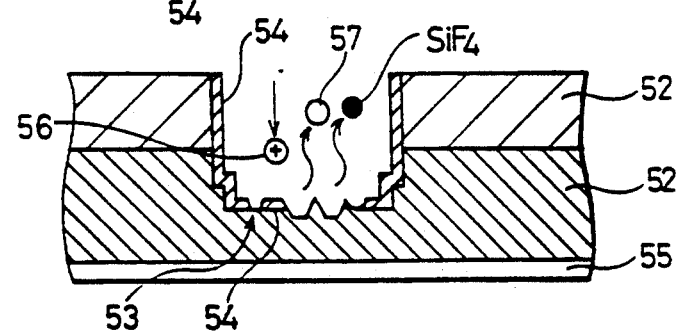
Figure 7C:
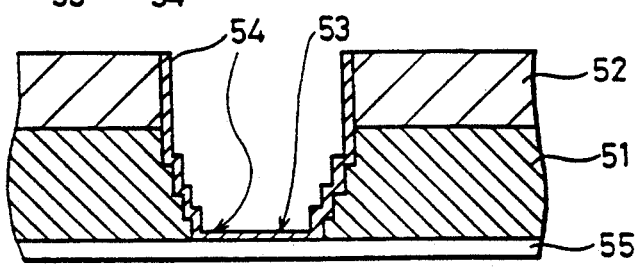

FIGS. 7A, 7B and 7C are diagrams for describing the mechanism of the generation of the angle θ with respect to the deposition of a film, respectively showing the steps of dry etching after a photoresist 52 is patterned by photolithography on the silicon oxide film 51 to be cured by Deep UV. This "Deep UV cure" is a process for improving the strength of a photoresist by directing UV light (ultraviolet light) onto the applied photoresist to promote crosslinking reaction of the base material of the photoresist in order to prevent pattern deficiency that occurs due to the photoresist being soft.

Figure 7D:
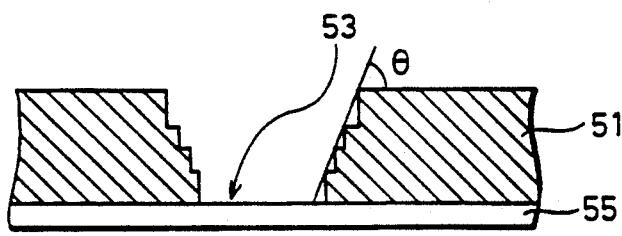

As shown in FIG. 7A, dry etching and deposition of a film (organic film) proceeds simultaneously. The deposition film 54 deposited at the bottom of the contact hole 53 is activated by the kinetic energy of ions 56 (ions accelerated by the ion sheath of plasma) introduced into the silicon substrate 55 to react with oxygen in the silicon oxide film 51 to be vaporized and removed as carbon monoxide or carbon dioxide 57. The silicon oxide film 51 having oxygen drawn out by this reaction results in silicon. This silicon reacts with etchant such as F radical to be vaporized as $SiF_4$ to be etched. Although etching proceeds in the contact hole bottom 53 by the above-described process, the deposition film 54 at the sidewall of the contact hole is not removed during the etching process because the incident probability of ions 56 is significantly lower at the sidewall than at the bottom. The deposition film 54 remaining at the sidewall of the contact hole serves as a mask during etching, whereby the diameter at the bottom of the contact hole gradually becomes smaller during the etching process of FIGS. 7B and 7C. FIG. 7D is a sectional view after an ashing process (oxygen plasma process) is applied following the step of FIG. 7C. It can be appreciated from FIG. 7D that the photoresist 52 is removed as well as the deposition film 54 by ashing, resulting in an angle of θ. Although the sidewall of the contact hole is shown in stepped portions in FIGS. 7B–7D for describing the generation of taper, the above-described reaction occurs continuously in practice, so that the sidewall is a smooth slanted surface. From the foregoing, it is appreciated that the deposition film at the sidewall of the contact hole becomes thicker in proportion to be amount of deposition, resulting in a smaller angle of θ.

The relationship between a deposition film and silicon selectivity will be described hereinafter. Although the deposition film on the silicon oxide film is removed by reacting with the oxygen in the oxide film, the deposition film deposited on the silicon substrate is not easily removed because there is no provision of oxygen thereto, and removal will be carried out only by physical sputtering by means of the incident energy of ions, as shown in FIG. 7C. The silicon is under a state guarded by the deposition film, so that reaction with etchant such as F radical is not easily promoted. Because the deposition film is slightly removed by the ion sputtering, there is also a slight progress in etching of the silicon. This is the mechanism of increase in the silicon selectivity with respect to a silicon oxide film in etching. Therefore, a higher etching selectivity of the silicon oxide film with respect to silicon can be obtained and the angle $\theta$ reduced by setting the etching conditions that will increase the deposition amount. Also, the etching selectivity of each contact hole can be monitored by checking the angle $\theta$.

The above embodiment is not limited to the described opening of a contact hole, and can be applied to any step of forming a hole. Particularly in the case of forming a through-hole which is a contact hole for forming contact between aluminum conductive interconnections of multilayers, there is a problem that the fluoride of the aluminum generated on the surface of the underlying aluminum conductive interconnection adversely affects the reliability of the interconnection if the overetching time period is increased. Because it is critical to reduce the amount of overetching as much as possible, the application of the above-described method to select an appropriate sectional area of a through-hole from the relationship between the dimension of the sectional area of the through hole and the etching rate allows the favorable results.

Although CHF$_3$/CF$_4$/Ar type of gas is employed in the etching condition, similar effects can be obtained by reducing the flow rate of O$_2$ (not more than 5%) with a CHF$_3$/O$_2$ type of gas. It is possible to realize an effect similar to the above-described embodiment with any gas type by setting conditions such as the flow ratio in the direction of increasing the deposition film.

Figure 8:
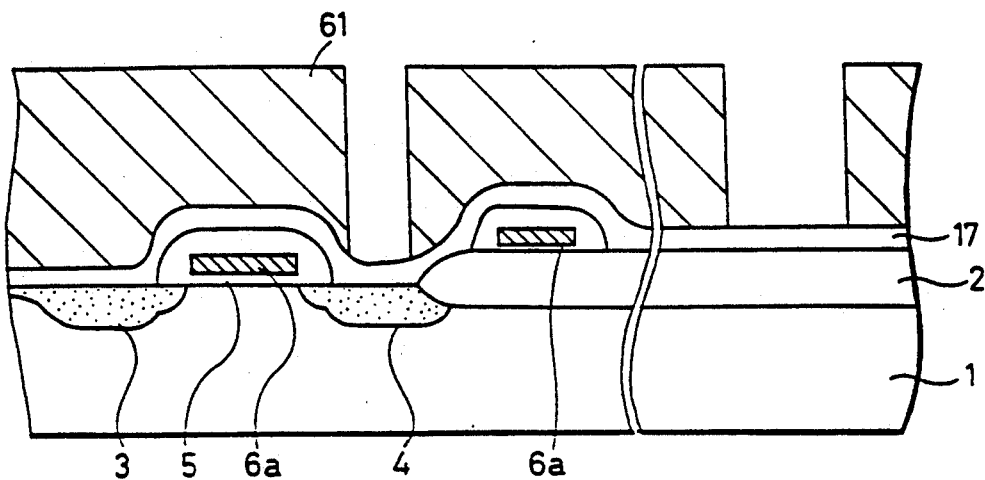
FIGS. 8, 9, 10, 11A and 12 are sectional views of a semiconductor device according to a second embodiment of the present invention showing the manufacturing steps thereof.
Figure 9:
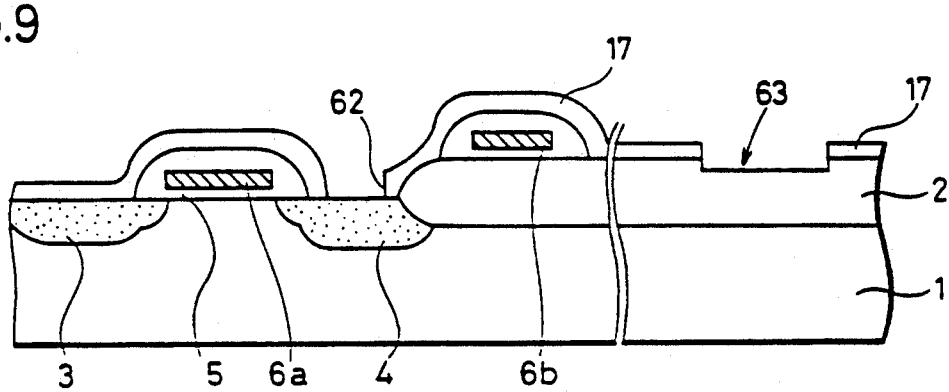

A second embodiment of the present invention will be described with reference to FIGS. 8-12. Referring to FIG. 8, a resist mask 61 of a predetermined pattern is formed by photolithograph after the formation of an interlayer insulating film 17 all over the semiconductor substrate 1, and then a contact hole 62 for establishing conduction between a storage node formed at a later step and the surface of the impurity diffusion region 4 of the semiconductor substrate 1 is formed. Simultaneously, a dent 63 is formed in the field insulating film 2 at the peripheral circuit. Here, the opening dimension of the dent 63 is set to a square with one side of 3.5 $\mu$m and the opening dimension of the contact hole 62 is set to a square with one side of 2 $\mu$m. After a reactive ion etching process of the interlayer insulating film 17 using a resist mask 61, the resist mask 61 is removed by an ashing process (oxygen plasma) process to result in the structure shown in FIG. 9. Because the thickness of the interlayer insulating film 17 is approximately 1300Å, and an overetching of approximately 20% is carried out in forming the dent 63, the depth of the dent 63 becomes approximately 1500Å.

Figure 10:
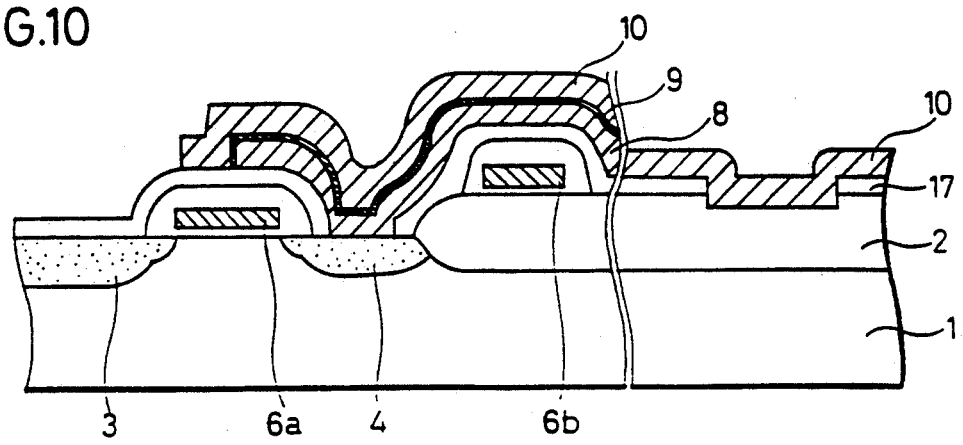
Figure 11A:
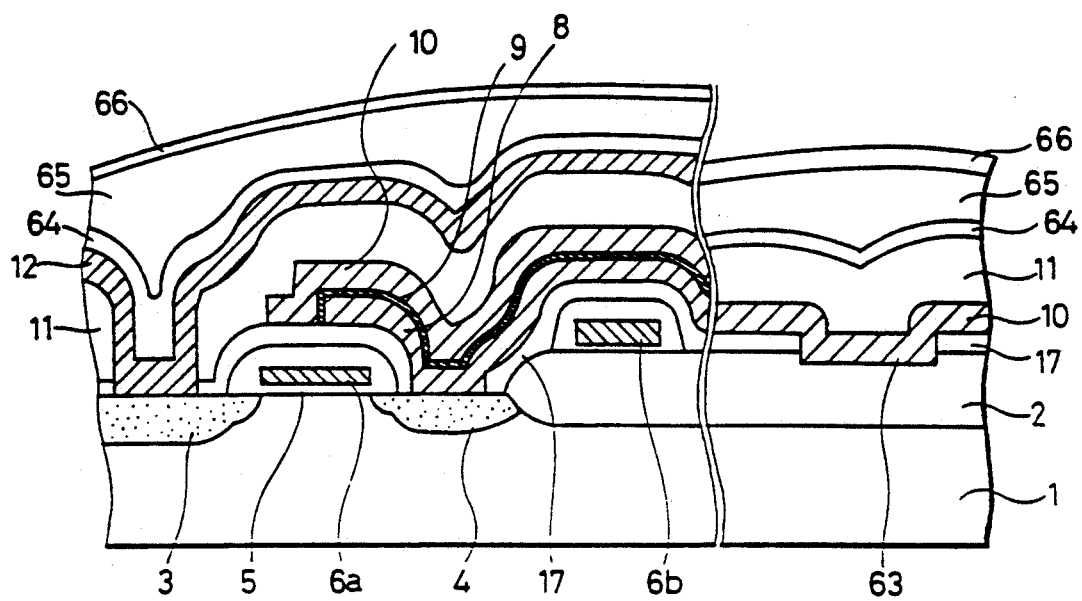
Figure 11B:
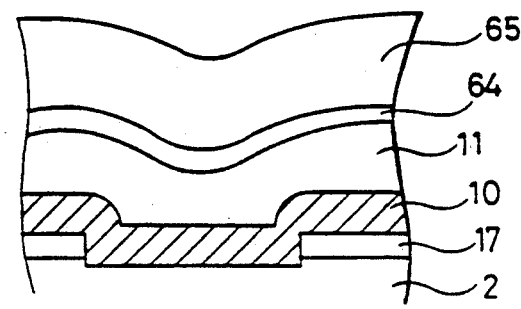
FIG. 11B is an enlarged sectional view of a semiconductor device right after the formation of a BPSG film 65 and before the planarization process.
Figure 11C:
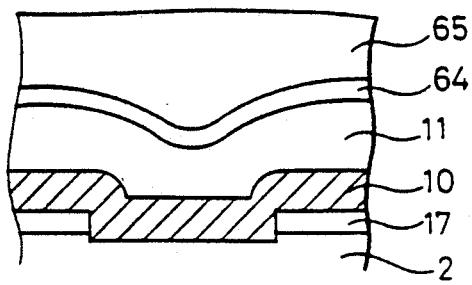
FIG. 11C is an enlarged sectional view of a semiconductor device where planarization is carried out by applying a thermal process to the BPSG film, followed by an etching back process.
Figure 12:
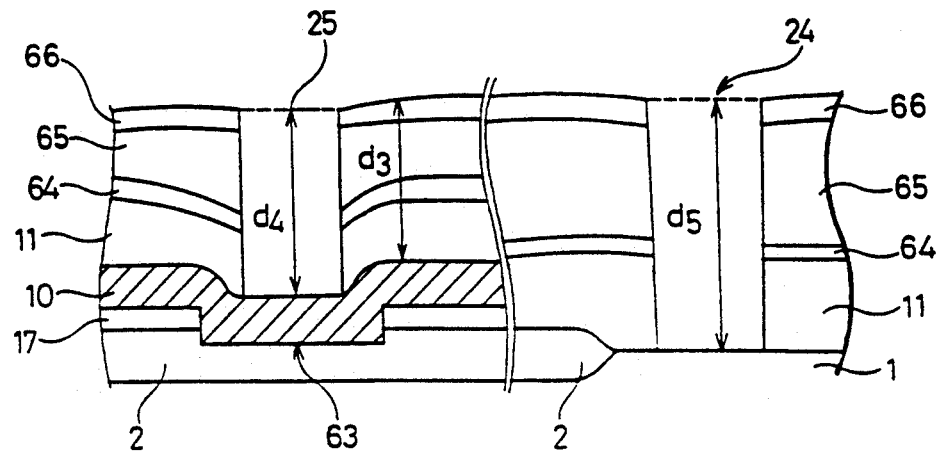

Next, a storage node 8, a dielectric film 9, and a cell plate 10 are formed to result in the structure shown in FIG. 10. Then, a bit line 12 is formed after the formation of an interlayer insulating film 11 between the bit line 12 and the cell plate 10. Next, an interlayer insulating film of a three layered structure of an underlying TEOS (Tetra Ethyl Ortho Silicate) film 64, a BPSG (Boro-Phospho Silicate Glass) film 65 and a TEOS film 66 having a thickness of 1000Å, 6000Å and 1000Å, respectively, is formed between the bit line 12 and the aluminum interconnection 67 to result in the structure shown in FIG. 11A. After the formation of the BPSC film and prior to the formation of the TEOS film 66, by carrying out planarization by a thermal process and an etchback of approximately 400Å, the surface is planarized as shown in FIG. 11C right after the deposition of a BPSG film (refer to FIG. 11B). Referring to FIG. 12, a contact hole 24 which directly contacts the surface of the semiconductor substrate 1 and a contact hole 25 which contacts the cell plate 10 in the region of the dent 63 are formed simultaneously by anisotropic etching. By the existence of a dent 63, the depth of the contact hole 25 is depth $d_4$ which is approximately 1500Å (i.e. the depth of the dent 63) deeper than the depth of $d_3$ which is the thickness of a conventional case. Therefore, the difference in depth with respect to the depth of $d_5$ of the contact hole 24 is reduced.

On carrying out a plurality of times the dry etching of contact holes according to the present embodiment, the yield was improved by approximately 5% in comparison with etching by a conventional method. This is because the amount of doped polysilicon of the cell plate 10 underlying the contact hole 25 is reduced by approximately 300Å owing to the depth of $d_4$ of the contact hole 25 becoming deeper by approximately 1500Å in comparison with the conventional depth of $d_3$.

A third embodiment of the present invention will be described hereinafter with reference to FIGS. 13-18. In the above second embodiment, the effect of preventing damage of the doped polysilicon by overetching was described. In the present embodiment, the effect of etchback in forming a tungsten plug will be described.

Figure 13:
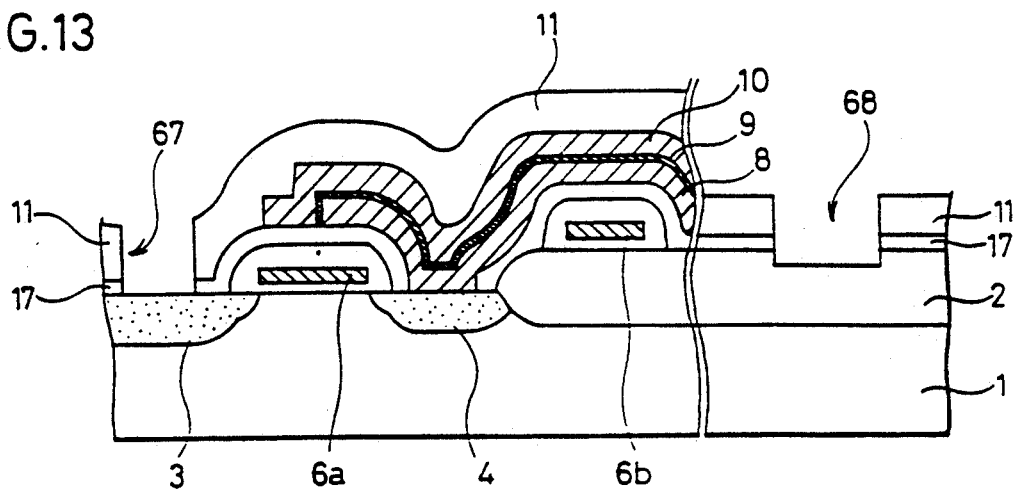
FIGS. 13, 14, 15, 16, 17 and 18 are sectional views of a semiconductor device according to a third embodiment of the present invention showing the manufacturing steps thereof.
Figure 14:
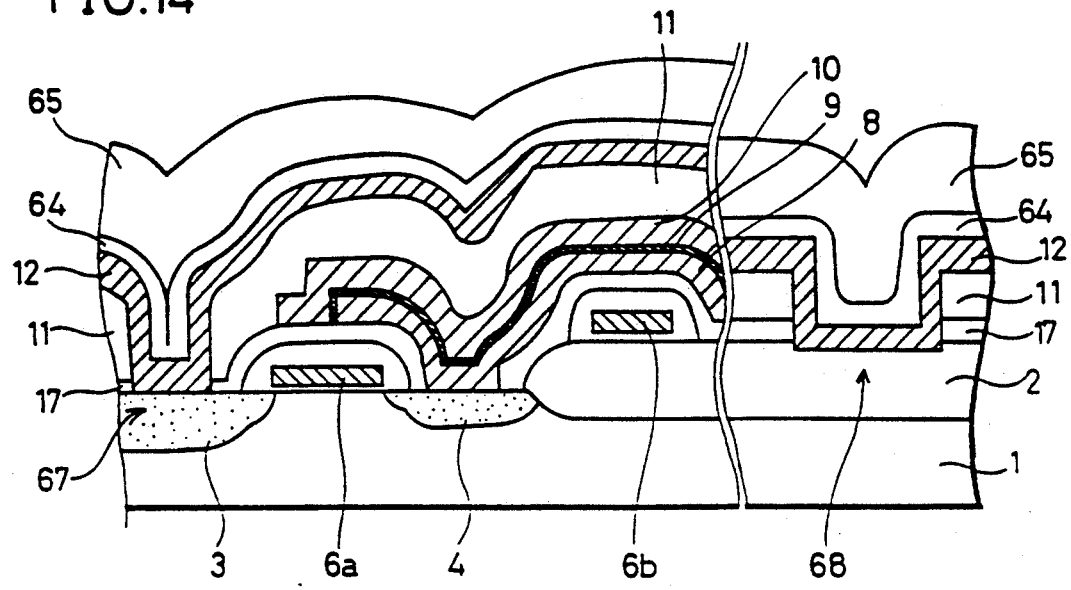
Figure 15:
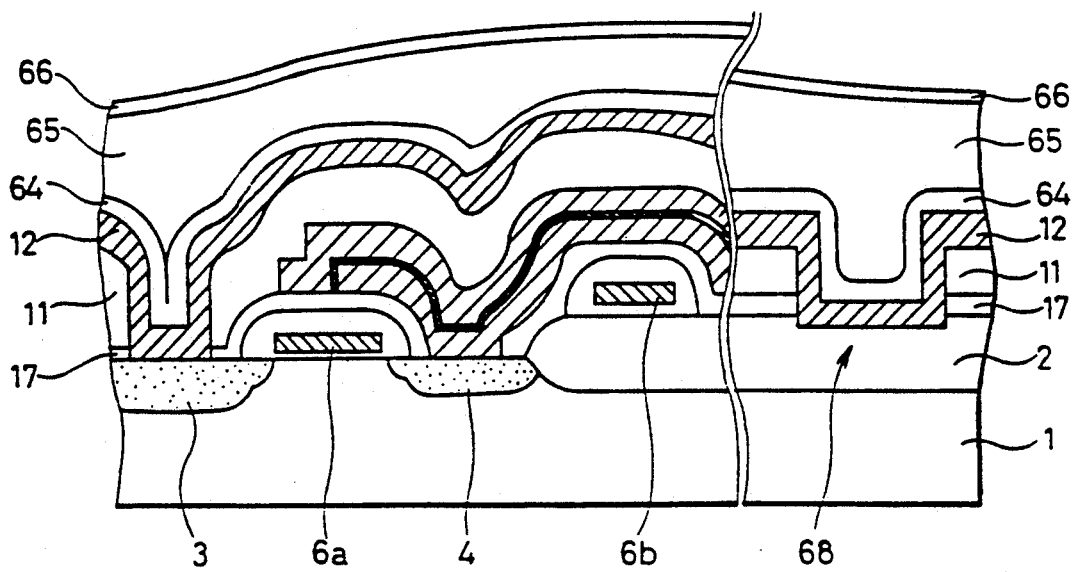

Referring to FIG. 13 following the formation of the cell plate 10 shown in FIG. 10, an interlayer insulating film 11 is formed between the cell plate 10 and the bit line 12. Then, a contact hole 67 to obtain contact between the bit line 12 and the surface of the semiconductor substrate 1, and a dent 68 at a predetermined position on the field insulating film 2 in the peripheral circuit are simultaneously formed by etching. The dimension of the opening of the dent 68 is set to a square of 5 $\mu$m which is greater by 2 $\mu$m in side dimension than the square of 3 $\mu$m of the opening of the contact hole 67. The etching time is set to overetch 20% of the 4500Å film thickness of the interlayer insulating film 11 and the depth of the dent 68 is set to be approximately 5400Å. After the formation of the bit line 12, the underlying TEOS film and the BPSG film are formed to a thickness of 1,000Å and 6000Å, respectively (FIG. 14). Following the formation of the BPSG film 65, planarization is carried out by a thermal treatment and an etchback of approximately 4000Å, followed by a deposition of a TEOS film 66 of approximately 1000Å, resulting in the planarized structure shown in FIG. 15.

Figure 16:
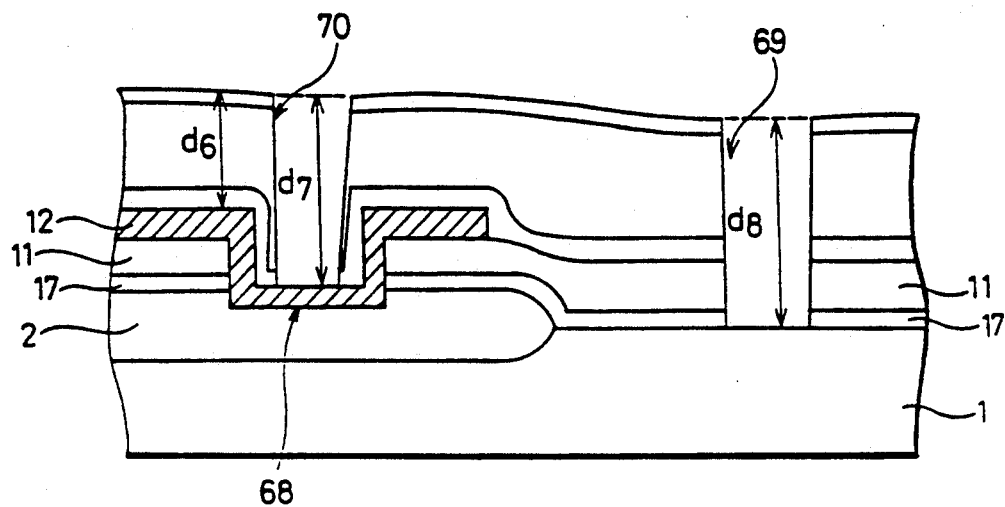
Figure 17:
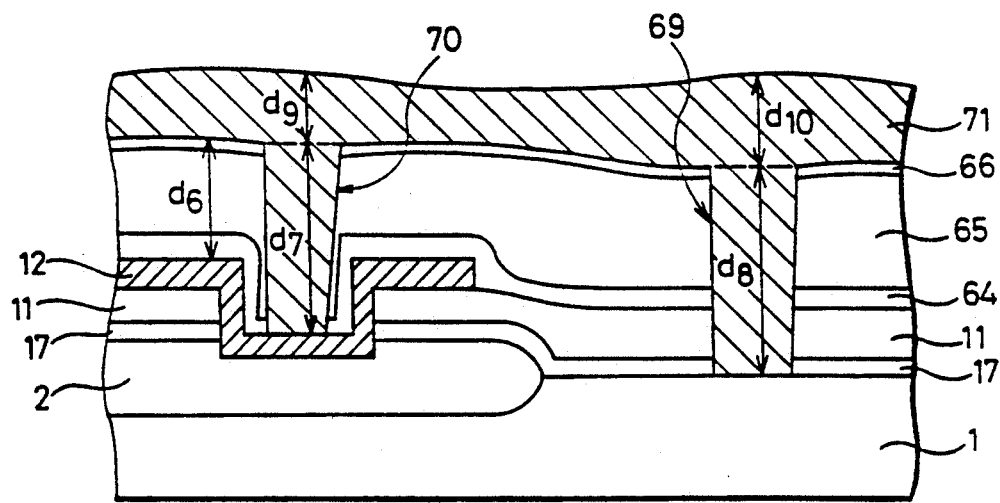
Figure 18:
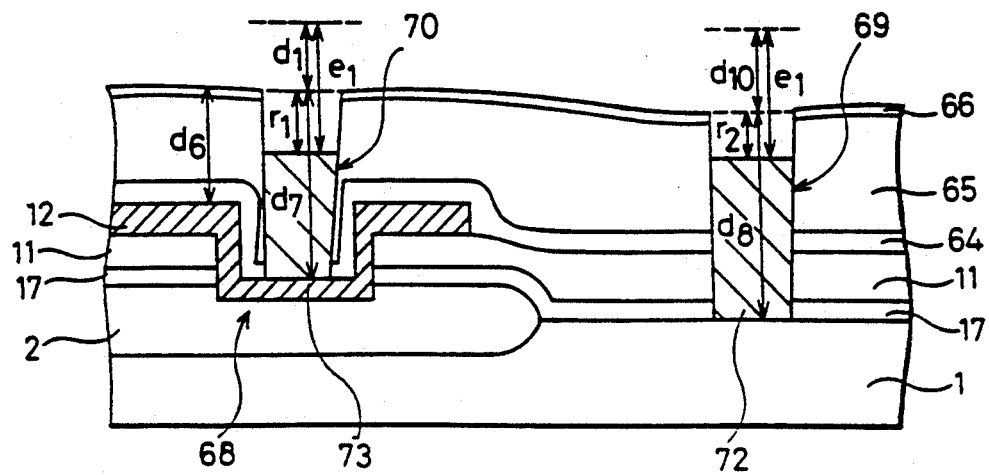
Figure 19:
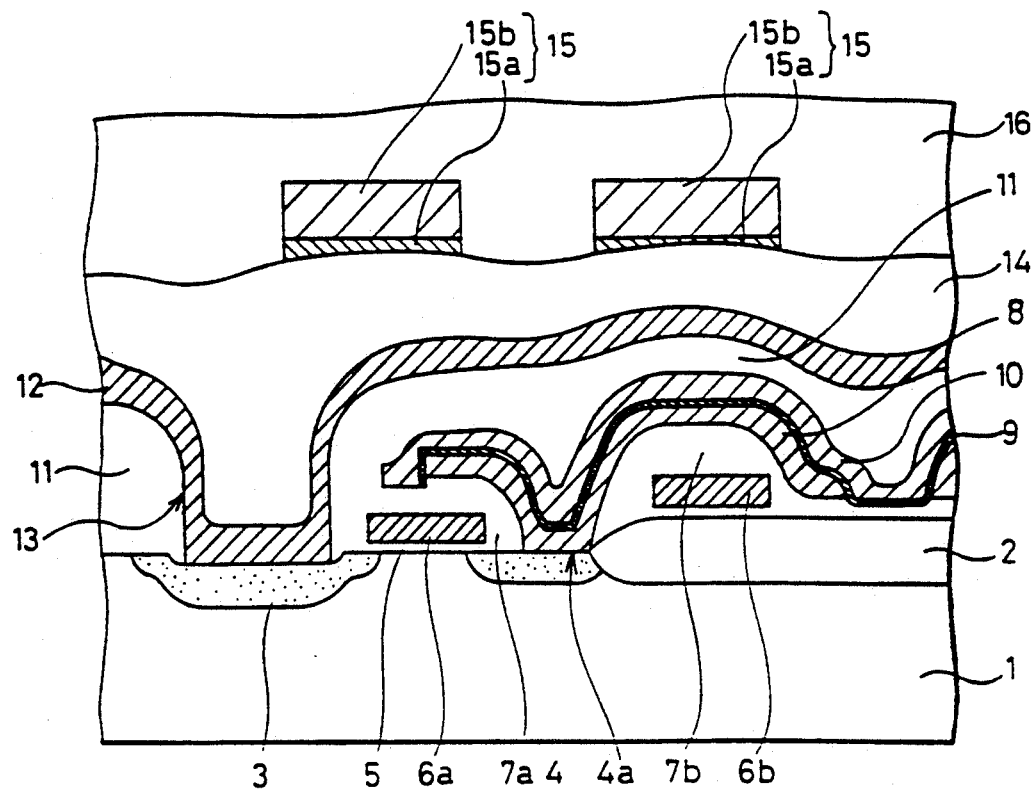
FIG. 19 is a sectional view of a structure of a DRAM in the proximity of a memory cell as an example of a structure of conventional semiconductor device.
Figure 20:
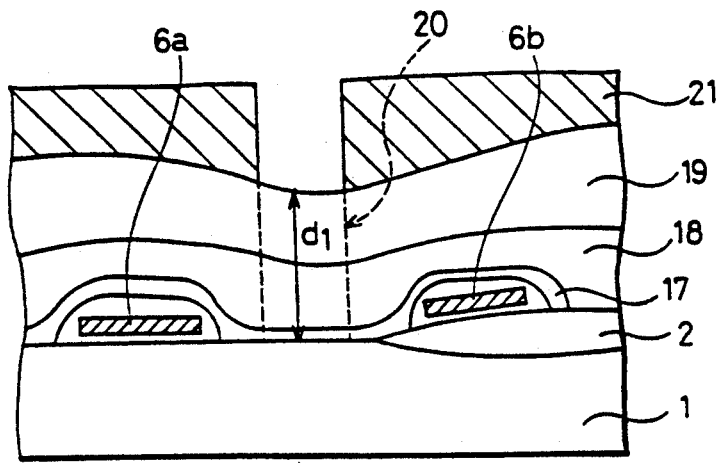
FIG. 20 is a structure where a resist mask is formed for forming a contact hole in an interlayer insulating film at a valley between adjacent elements, and is a sectional view of where the interlayer insulating film is relatively planarized.
Figure 21:
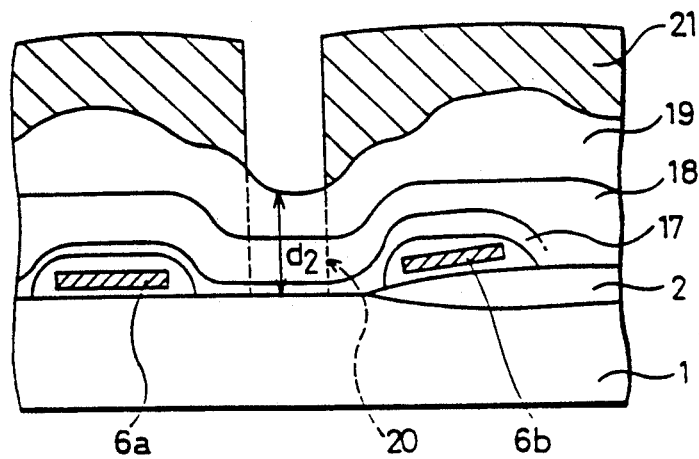
FIG. 21 is a sectional view of a structure where a resist mask is formed at a valley of adjacent element for forming a contact hole in an interlayer insulating film, in which planarization process is not applied to the interlayer insulating film.
Figure 22:
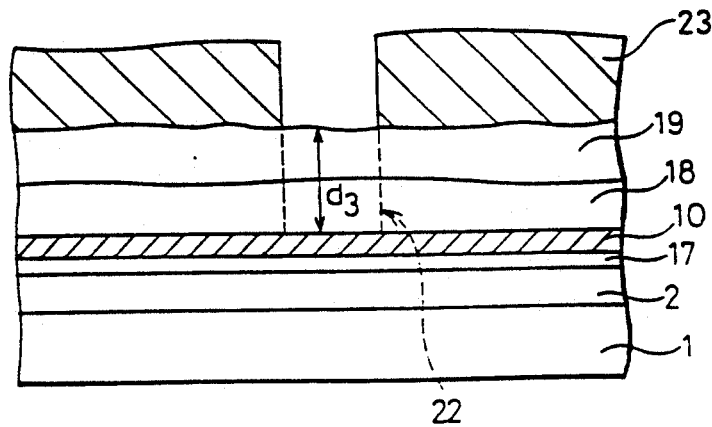
FIG. 22 is a sectional view of a resist mask formed at a valley of adjacent conductive interconnections for forming a contact hole of a relatively small depth in an interlayer insulating film.
Figure 23:
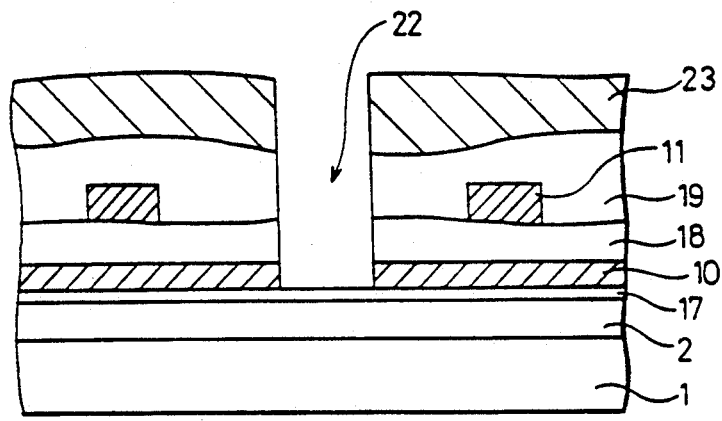
FIG. 23 is a sectional view of the structure of FIG. 22 subjected to anisotropic etching to have a contact hole formed, showing the case where the contact hole penetrates the doped polysilicon layer due to overetching.
Figure 24:
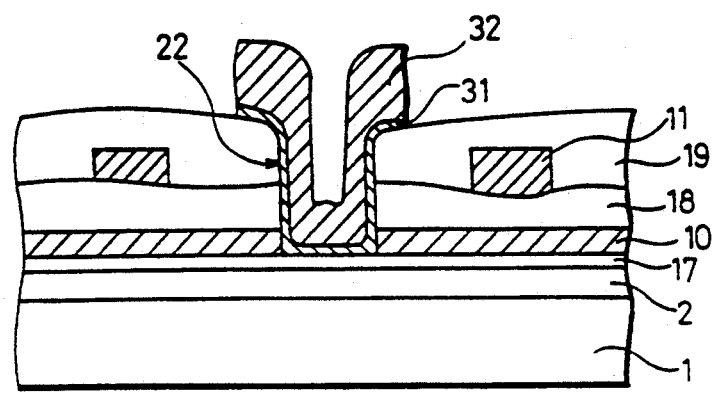
FIG. 24 is a sectional view showing the state where a conductive interconnection having a double structure of a barrier metal layer and an aluminum alloy layer is formed on the surface including the inner sidewall of the formed contact hole of FIG. 23.
Figure 25:
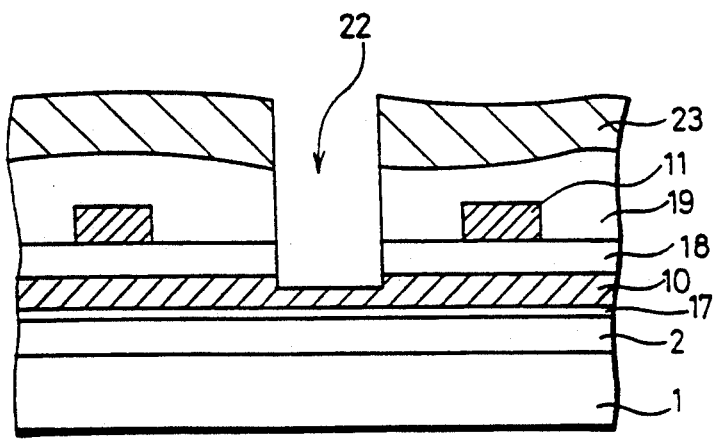
FIG. 25 is a sectional view substantially similar to that of FIG. 23, showing the case where the doped polysilicon layer is not completely penetrated by the contact hole but reduced by overetching.
Figure 26:
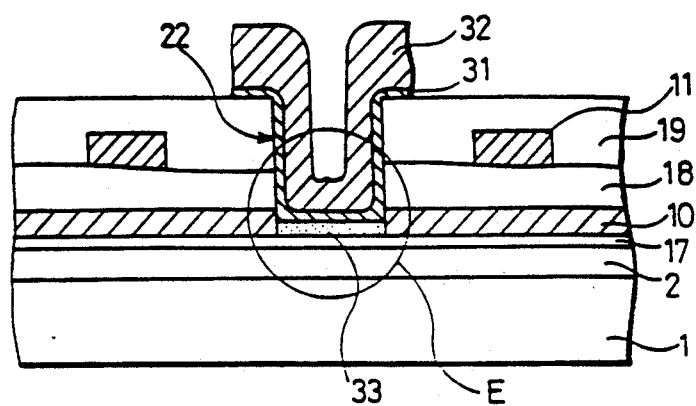
FIG. 26 is a sectional view showing the state where a conductive interconnection having a double structure of a barrier metal layer and an aluminum alloy layer is formed on the surface including the inner sidewall of the formed contact hole of FIG. 25.

Referring to FIG. 16, a contact hole 69 directly in contact with the surface of the semiconductor substrate 1 and a contact hole 70 in contact with the bit line 12 in the region of the dent 68 are formed simultaneously by etching. Referring to FIG. 17, tungsten 71 for a tungsten plug is deposited all over the semiconductor substrate 1. Then, the tungsten 71 is etched back to form tungsten plugs 73 and 73 in contact holes 69 and 70.

The film thickness $d_9$ in the proximity of the contact hole 70 and the film thickness $d_{10}$ of the tungsten 71 on the contact hole 69 right after the deposition of tungsten 71 of FIG. 17 respectively depend upon the dimension of the openings of the contact holes. Assuming that $d_9 < d_{10}$, the bit line 12 will not be etched (FIG. 18) even if the tungsten (thickness $d_{10}$) above the contact hole 69 is thoroughly etched back (the amount of etch back is $e_1$ shown in FIG. 18) because the depth $d_7$ of the contact hole 70 is approximately 5400Å deeper according to the structure of the present embodiment in comparison with the depth of $d_6$ of a conventional method. The etch back of the tungsten must be carried out sufficiently so that the residue of the tungsten (the residue of titanium nitride in the case of a double layered structure forming a titanium nitride film as a barrier metal in the lower layer of the tungsten) is not left on the surface of the TEOS film 66. For example, when $d_9$ is 5000Å and $d_{10}$ is 7500Å, the etch back amount $e_1$ is set to approximately 10500Å. The specification of such an etching amount will generate reductions $r_1$ and $r_2$ of approximately 3000Å–5000Å from the surface of the TEOS film 66, where $r_1$ and $r_2$ are:

$$r_1 = e_1 - d_9 = 5500\text{Å}$$

$$r_2 = e_1 - d_{10} = 3000\text{Å}$$

The film thickness of the tungsten residue on the bit line 12 of the contact hole 70 is:

Film thickness of tungsten residue $= d_7 - r_1 = 4400$Å

This means that there is sufficient margin of etching to the bit line 12.

Although the above-described second and third embodiments have the formation of dents 63 and 68 carried out simultaneous with the formation of each interlayer insulating film, only the dent may be manufactured independently in a separate step by forming a separate mask.

According to the above-described embodiments, it is possible to control the etching rate by appropriately setting the dimension of the opening of the contact hole in accordance with the depth, so that damage in the underlying layer or opening deficiency can be prevented in forming a plurality of contact holes of different depths.

It is possible to increase the depth of the contact hole by forming a dent of an appropriate depth underlying the region where the contact hole is to be formed, so that various problem in forming a plurality of contact holes of different depths are also solved. Furthermore, the problem of damage in the underlying layer caused by overetching in forming a tungsten plug in a contact hole can be solved by applying the method into an etchback step of tungsten.

Although the present invention has been described and illustrated in detail, it is clearly understood that the same is by way of illustration and example only and is not to be taken by way of limitation, the spirit and scope of the present invention being limited only by the terms of the appended claims.

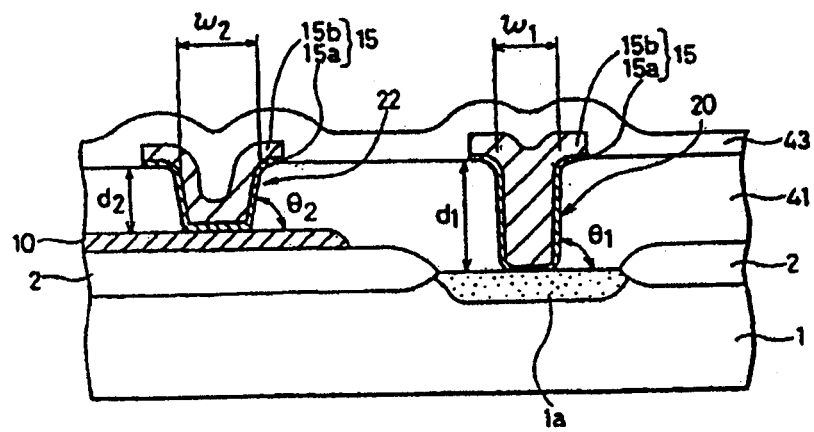

What is claimed is:

1. A semiconductor device comprising:
    an interlayer insulating film formed between conductive layers,
    a first contact hole formed penetrating said interlayer insulating film for electrically connecting the conductive layers, and
    a second contact hole of a depth greater than that of said first contact hole, formed penetrating said interlayer insulating film for electrically connecting the conductive layers,
    wherein said second contact hole is formed to have a diameter smaller than that of said first contact hole and an inclining angle of an inner circumferential wall of said first contact hole is greater than that of said second contact hole.

2. The semiconductor device according to claim 1, wherein a conductive interconnection layered of a barrier metal layer and an aluminum alloy layer is buried in said first contact hole and in said second contact hole.

3. The semiconductor device according to claim 1, wherein said first contact hole is formed to expose a surface of a conductive layer formed on a semiconductor substrate with a field insulating film therebetween,
    wherein said second contact hole is formed to expose a surface of an impurity diffusion layer formed at a surface of said semiconductor substrate.

4. A semiconductor device comprising:
    a first interlayer insulating film formed on a surface of a semiconductor substrate and having a first dent of a predetermined diameter and depth formed at a predetermined position,
    a conductive interconnection layer formed on the surface of said first interlayer insulating film including an entire internal surface of said first dent so that a second dent is formed on an upper surface of the conductive interconnection layer covering said first dent,
    a second interlayer insulating film formed on said conductive interconnection layer,
    wherein a contact hole having a diameter smaller than that of said second dent is formed in a portion of said second interlayer insulating film covering the bottom of said second dent.

5. A semiconductor device comprising:
    a first interlayer insulating film formed expanding over a first region on a semiconductor substrate and on a second region higher than the first region from the surface of said semiconductor substrate and having a first dent of a predetermined diameter and depth formed in said second region,
    a conductive interconnection layer formed on said first interlayer insulating film including an entire surface of said first dent and having a second dent formed in an area of said conductive interconnection layer covering said first dent, and
    a second interlayer insulating film formed on said conductive interconnection layer,
    wherein a contact hole having a diameter smaller than that of said second dent is formed in a portion of said second interlayer insulating film covering the bottom of said second dent.

6. The semiconductor device according to claim 5, wherein said first region forms an active region on a main surface of said semiconductor substrate, and said second region forms a field insulating region on a main surface of said semiconductor substrate.

7. The semiconductor device according to claim 6, wherein said conductive interconnection layer forms an upper electrode of a capacitor of a memory cell of a DRAM.

8. The semiconductor device according to claim 6, wherein said first conductive interconnecting layer forms 9. The semiconductor device according to claim 6, wherein said first dent penetrates said first interlayer insulating film, and a bottom thereof is located in a internal of said field insulating film.

* * * * *

UNITED STATES PATENT AND TRADEMARK OFFICE
CERTIFICATE OF CORRECTION

PATENT NO.       : 5,317,193
APPLICATION NO.  : 08/029509
DATED            : May 31, 1994
INVENTOR(S)      : Shinya Watanabe Page 1 of 3

It is certified that error appears in the above-identified patent and that said Letters Patent is hereby corrected as shown below:

In the Figure on the Title page, change the reference character "$\theta$" to --$\theta_2$-- and (see attached).
in Drawing Sheet 1 of 16, Figure 1A, change the reference character "$\theta$" to --$\theta_2$-- (see attached).

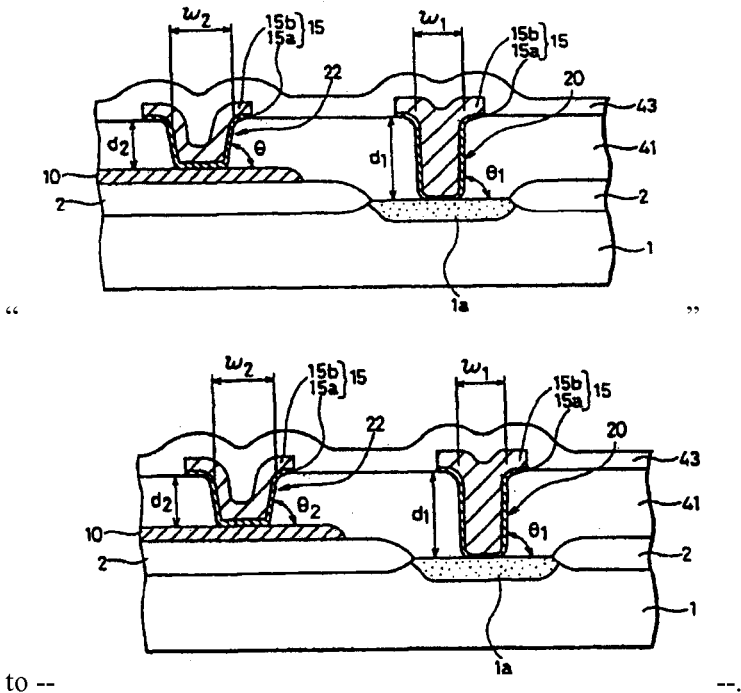

to --                                                                --.

In column 8, line 36, after the word of, change "$D_1$" to --$d_1$--.
In column 8, line 36, after the word and, change "$D_2$" to --$d_2$--.
In column 8, line 42, after the word of, change "0" to --$\theta_1$--.
In column 8, line 42, after the second occurrence of the word and, change "Oz" to --$\theta_2$--.
In column 10, line 12, after the word angle, change "0" to --$\theta$--.
In column 10, line 15, after the word angle, change "8" to --$\theta$--.
In column 14, line 1, after the word is, change "greater" to --less--.

Signed and Sealed this
Seventeenth Day of May, 2011

David J. Kappos
*Director of the United States Patent and Trademark Office*

United States Patent [19]

Watanabe

[11] Patent Number: 5,317,193
[45] Date of Patent: May 31, 1994

[54] CONTACT VIA FOR SEMICONDUCTOR DEVICE

[75] Inventor: Shinya Watanabe, Hyogo, Japan

[73] Assignee: Mitsubishi Denki Kabushiki Kaisha, Tokyo, Japan

[21] Appl. No.: 29,509

[22] Filed: Mar. 11, 1993

[30] Foreign Application Priority Data

May 7, 1992 [JP] Japan .................................. 4-114945

[51] Int. Cl.$^5$ ...................... H01L 23/48; H01L 29/40
[52] U.S. Cl. .................................. 257/774; 257/775; 257/773
[58] Field of Search ...................... 257/774, 775, 773

[56] References Cited

U.S. PATENT DOCUMENTS

| | | | |
|---|---|---|---|
| 4,640,738 | 2/1987 | Fredericks et al. | 257/774 |
| 4,872,050 | 10/1989 | Okamoto et al. | 257/774 |
| 5,063,175 | 11/1991 | Broadbent | 257/774 |

FOREIGN PATENT DOCUMENTS

60-224245  11/1985  Japan .................................. 257/775

OTHER PUBLICATIONS

Nojiri et al, "Microwave Plasma Etching of Silicon Dioxide for Half-Micron ULSIs", Amended Abstract of the 21st Conference on Solid State Devices and Materials (1989), pp. 153-156.

Kato et al, "Measurement of Ion Scattering Observed by Etching Feature in Reactive Ion Etching", 1989 Dry Process Symposium, pp. 33-38.

*Primary Examiner*—William D. Larkins
*Assistant Examiner*—Stephen D. Meier
*Attorney, Agent, or Firm*—Lowe, Price, LeBlanc & Becker

[57] ABSTRACT

The etching selectivity is controlled by appropriately changing the dimension of the opening of each contact holes in forming simultaneously a plurality of contact holes of different depth by etching. By forming a dent in advance underlying the region where a contact hole is to be formed, the depth of the contact hole can be increased, whereby difference in the depths of the plurality of contact holes can be reduced. As a result, damage in the underlying layer or under etching in forming a plurality of contact holes of different depth simultaneously by etching can be solved.

9 Claims, 16 Drawing Sheets